US009997407B2

(12) United States Patent
Basker et al.

(10) Patent No.: US 9,997,407 B2
(45) Date of Patent: *Jun. 12, 2018

(54) VOIDLESS CONTACT METAL STRUCTURES (71) Applicant: International Business Machines Corporation, Armonk, NY (US)

(72) Inventors: Veeraraghavan S. Basker, Schenectady, NY (US); Nicolas L. Breil, Beacon, NY (US); Oleg Gluschenkov, Tannersville, NY (US); Shogo Mochizuki, Clifton Park, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/270,808

(22) Filed: Sep. 20, 2016

(65) Prior Publication Data

US 2017/0170064 A1  Jun. 15, 2017

Related U.S. Application Data (62) Division of application No. 14/969,822, filed on Dec. 15, 2015, now Pat. No. 9,449,921.

(51) Int. Cl.
*H01L 21/768* (2006.01)
*H01L 23/528* (2006.01)
*H01L 23/522* (2006.01)

(52) U.S. Cl.
CPC .. *H01L 21/76883* (2013.01); *H01L 21/76801* (2013.01); *H01L 21/76843* (2013.01);
(Continued)

(58) Field of Classification Search
CPC ......... H01L 21/76883; H01L 21/76843; H01L 23/5283; H01L 23/5226; H01L 21/76801; H01L 21/76877

See application file for complete search history.

(56) References Cited

U.S. PATENT DOCUMENTS 6,707,154 B2   3/2004  Terauchi et al.
6,910,907 B2   6/2005  Layadi et al.
(Continued)

FOREIGN PATENT DOCUMENTS

JP   201529097 A   2/2015

OTHER PUBLICATIONS

List of IBM Patents or Patent Applications Treated as Related dated Sep. 20, 2016, 2 pages.

*Primary Examiner* — Savitr Mulpuri
(74) *Attorney, Agent, or Firm* — Scully, Scott, Murphy & Presser, P.C.; Daniel P. Morris, Esq.

(57) ABSTRACT

Voidless contact metal structures are provided. In one embodiment, a voidless contact metal structure is provided by first providing a first contact metal that contains a void within a contact opening. The void is then opened to provide a divot in the first contact metal. After forming a dielectric spacer atop a portion of first contact metal, a second contact metal is then formed that lacks any void. The second contact metal fills the entirety of the divot within the first contact metal. In another embodiment, two diffusion barrier structures are provided within a contact opening, followed by the formation of a contact metal structure that lacks any void.

11 Claims, 6 Drawing Sheets

(52) U.S. Cl.
CPC .... *H01L 21/76877* (2013.01); *H01L 23/5226* (2013.01); *H01L 23/5283* (2013.01)

(56) References Cited

U.S. PATENT DOCUMENTS

| | | | |
|---|---|---|---|
| 7,138,337 B2 | 11/2006 | Lin | |
| 7,749,835 B2 | 7/2010 | Li et al. | |
| 7,884,343 B2 | 2/2011 | Lung | |
| 7,955,972 B2 | 6/2011 | Chang et al. | |
| 8,039,381 B2 | 10/2011 | Yeh et al. | |
| 8,609,491 B2 * | 12/2013 | Hwang | H01L 27/10885 438/156 |
| 8,623,733 B2 | 1/2014 | Chen et al. | |
| 8,735,235 B2 | 5/2014 | Chuang et al. | |
| 8,742,592 B2 * | 6/2014 | Wakatsuki | H01L 21/28556 257/763 |
| 8,846,470 B2 | 9/2014 | Booth, Jr. et al. | |
| 8,846,489 B2 | 9/2014 | Lin et al. | |
| 9,034,703 B2 | 5/2015 | Cheng et al. | |
| 9,219,470 B1 | 12/2015 | Venditti | |
| 2004/0018696 A1 | 1/2004 | Wieczorek et al. | |
| 2005/0023686 A1 * | 2/2005 | Lin | H01L 21/76846 257/751 |
| 2005/0054191 A1 * | 3/2005 | Yu | H01L 21/76846 438/629 |
| 2007/0205482 A1 * | 9/2007 | Yang | H01L 21/02063 257/499 |
| 2008/0012134 A1 * | 1/2008 | Choi | H01L 21/76846 257/751 |
| 2008/0194105 A1 * | 8/2008 | Dominguez | C23C 16/18 438/681 |
| 2009/0169760 A1 * | 7/2009 | Akolkar | C23C 14/025 427/455 |
| 2011/0089484 A1 * | 4/2011 | Lim | H01L 21/28114 257/330 |
| 2011/0266676 A1 * | 11/2011 | Isobayashi | H01L 21/76831 257/751 |
| 2012/0306049 A1 * | 12/2012 | Booth, Jr. | H01L 28/92 257/532 |
| 2013/0175637 A1 * | 7/2013 | Chang | H01L 21/823468 257/383 |
| 2013/0302980 A1 | 11/2013 | Chandrashekar et al. | |
| 2014/0138837 A1 * | 5/2014 | Niu | H01L 21/76846 257/773 |
| 2014/0154883 A1 | 6/2014 | Humayun et al. | |
| 2014/0349477 A1 | 11/2014 | Chandrashekar et al. | |
| 2015/0024592 A1 | 1/2015 | Chandrashekar et al. | |
| 2015/0050807 A1 | 2/2015 | Wu et al. | |
| 2015/0145062 A1 | 5/2015 | Chudzik et al. | |
| 2015/0214354 A1 * | 7/2015 | Nakano | H01L 29/0869 257/77 |
| 2015/0372684 A1 | 12/2015 | Francom et al. | |
| 2017/0053865 A1 * | 2/2017 | Lin | H01L 23/528 |

* cited by examiner

VOIDLESS CONTACT METAL STRUCTURES

BACKGROUND

The present application relates to semiconductor technology. More particularly, the present application relates to methods of forming a semiconductor structure including at least one contact structure containing a voidless contact metal structure located within a contact opening. The present application also relates to a semiconductor structure including at least one contact structure that can be formed by the methods of the present application.

In the field of semiconductor technology, it is well known to form contact metal structures within a dielectric material that contact one or more conductive regions of an underlying substrate. In one example, the one or more conductive regions may be a source region and/or a drain region that is formed in a semiconductor material, and/or a topmost portion of a gate electrode of a field effect transistor.

The formation of contact metal structures is a considerable challenge as the integration density of semiconductor devices is increased as a consequence of technology scaling. In one example, it is becoming extremely difficult to provide contact metal structures that do not contain any voids and/or keyholes. The presence of voids and/or keyholes within a contact metal structure may cause unwanted yield degradation.

In another example, and with the dimensions shrinking between the contact area (CA) and the gate structure (PC), the parasitic capacitance between the CA and PC will have a negative impact on the dynamic performance of the semiconductor device.

In view of the above, there is a need to provide new and improved contact metal structures that avoid the problems mentioned with prior art contact metal structures.

SUMMARY

Voidless contact metal structures are provided. In one embodiment, a voidless contact metal structure is provided by first providing a first contact metal that contains a void within a contact opening. The void is then opened to provide a divot in the first contact metal. After forming a dielectric spacer atop a portion of first contact metal, a second contact metal is then formed that lacks any void. The second contact metal fills the entirety of the divot within the first contact metal. In another embodiment, two diffusion barrier structures are provided within a contact opening, followed by the formation of a contact metal structure that lacks any void.

In one aspect of the present application, a method of forming a semiconductor structure, i.e., contact structure, is provided. In one embodiment of the present application, the method includes providing, from bottom to top, a base structure and a dielectric structure, wherein a conductive material portion is embedded in the base structure, and wherein a contact opening is located within the dielectric structure. Next, a diffusion barrier portion is formed within a lower portion of the contact opening and a first contact metal structure is formed on the diffusion barrier portion, wherein a divot is present at an upper portion of the first contact metal structure. A pair of spaced apart dielectric spacers is then formed within the contact opening and on a topmost surface of the diffusion barrier portion and a portion of a topmost surface of the first contact metal structure, wherein each dielectric spacer has a sidewall surface contacting a sidewall surface of the dielectric structure. Next, a second contact metal structure is formed within the contact opening and between the pair of dielectric spacers, wherein a portion of the second contact metal structure completely fills the divot present in the first contact metal structure.

In another embodiment of the present application, the method includes providing, from bottom to top, a base structure and a dielectric structure, wherein a conductive material portion is embedded in the base structure, and wherein a contact opening is located within the dielectric structure. A first diffusion barrier layer is then formed within a portion of the contact opening and contacting a first portion of each sidewall surface of the dielectric structure, the first diffusion barrier layer having a topmost surface that is located beneath a topmost surface of the dielectric structure. Next, a second diffusion barrier layer is formed on the first diffusion barrier layer and contacting a second portion of each sidewall surface of the dielectric structure, the second diffusion barrier layer extending on to the topmost surface of the dielectric structure. A contact metal is then formed within the opening and on the second diffusion barrier layer. Next, portions of the contact metal and the second diffusion barrier layer that are present on the topmost surface of the dielectric structure are removed.

In another aspect of the present application, a semiconductor structure containing at least one contact structure is provided. In one embodiment of the present application, the at least one contact structure includes, from bottom to top, a base structure and a dielectric structure, wherein a conductive material portion is embedded in the base structure, and wherein a contact opening is located within the dielectric structure. A diffusion barrier portion is located within a lower portion of the contact opening, and a first contact metal structure is located on the diffusion barrier portion. In accordance with this embodiment of the present application, a divot is present at an upper portion of the first contact metal structure. The at least one contact structure also includes a pair of spaced apart dielectric spacers located within the contact opening and on a topmost surface of the diffusion barrier portion and a portion of a topmost surface of the first contact metal structure. Each dielectric spacer has a sidewall surface contacting a sidewall surface of the dielectric structure. The at least one contact structure further includes a second contact metal structure located within the contact opening and between the pair of dielectric spacers. A portion of the second contact metal structure completely fills the divot present in the first contact metal structure.

DETAILED DESCRIPTION

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Figure 1:
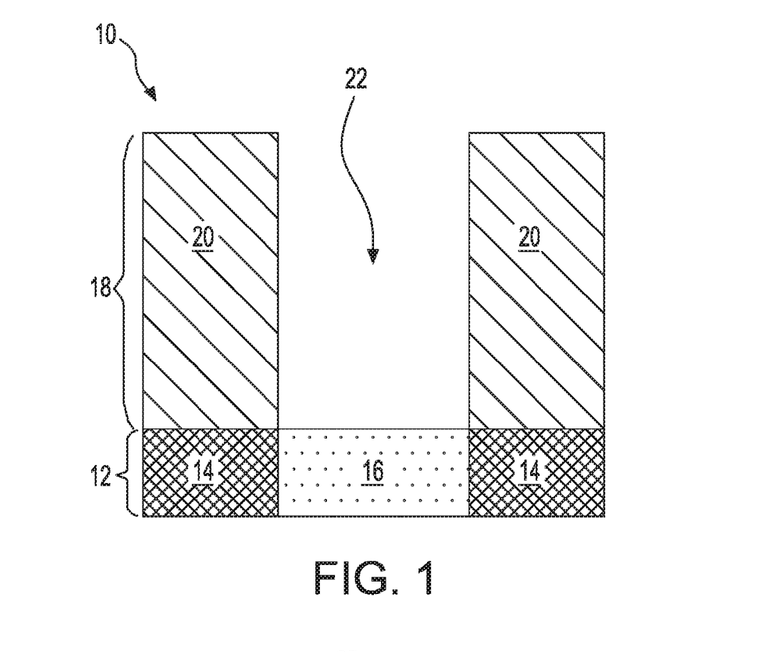
FIG. 1 is a cross sectional view of an exemplary contact structure during an early stage of fabrication and including a base structure and a dielectric structure, wherein a contact opening is present in the dielectric structure which exposes a surface of a conductive material portion within the base structure in accordance with an embodiment of the present application.

Referring first to FIG. 1, there is illustrated an exemplary contact structure 10 during an early stage of fabrication and including a base structure 12 and a dielectric structure 18, wherein a contact opening 22 is present in the dielectric structure 18 which exposes a surface of a conductive material portion 16 that is embedded in the base structure 12.

In addition to the conductive material portion 16, the base structure 12 further includes a non-conductive material portion 14 located at least on both sides of the conductive material portion 16. Thus, the conductive material portion 16 of the base structure 12 is surrounded on both sides by a non-conductive material portion 14. In some embodiments (not shown), the non-conductive material portion 14 may extend beneath a portion, or an entirety, of the conductive material portion 16. As is shown, each non-conductive material portion 14 of the base substrate 12 has a topmost surface that is coplanar with a topmost surface of the conductive material portion 16 of the base structure 12.

In one embodiment of the present application, the conductive material portion 16 may comprise a doped semiconductor material. In such an embodiment, the doped semiconductor material that provides the conductive material portion 16 of the base structure 12 may be a source region and/or a drain region of a semiconductor device such, as for example, a field effect transistor. In some embodiments, the doped semiconductor material that provides the conductive material portion 16 may be a topmost surface of a gate conductor (or electrode) of a field effect transistor.

The doped semiconductor material that can provide the conductive material portion 16 may include a p-type or an n-type dopant. The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium and indium. "N-type" refers to the addition of impurities that contributes free electrons to an intrinsic semiconductor. In a silicon containing semiconductor material, examples of n-type dopants, i.e., impurities, include, but are not limited to, antimony, arsenic and phosphorous.

The doped semiconductor material that can provide the conductive material portion 16 may include any semiconductor material that has semiconducting properties. Exemplary semiconductor materials that can be used as the doped semiconductor material include, but are not limited to, Si, Ge, SiGe alloys, SiGeC alloys, III-V compound semiconductors and/or II-V compound semiconductors. In one embodiment, the doped semiconductor material that can provide the conductive material portion 16 may include a single semiconductor material such as, for example, Si. In another embodiment, the doped semiconductor material that can provide the conductive material portion 16 may include a multilayered stack of at least two different semiconductor materials such as, for example, Si and a SiGe alloy. The semiconductor material that can provide the doped semiconductor material can be a single crystalline semiconductor material, a polycrystalline semiconductor material or an amorphous semiconductor material.

In one embodiment of the present application, the conductive material portion 16 may include at least one of an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), and an elemental metal silicide (e.g., tungsten silicide, nickel silicide, and titanium silicide). In such an embodiment, the conductive material portion 16 can be a topmost surface of a gate conductor of a field effect transistor. When a metal silicide is employed as the conductive material portion 16, the metal silicide can, in some embodiments, be present directly upon a source region or a drain region that is formed within a semiconductor material.

In some embodiments of the present application, the non-conductive material portion 14 may be a semiconductor material such as described above for the doped semiconductor material. The non-conductive material portion 14 is typically a semiconductor material when the conductive material portion 16 is a source region or drain region. In another embodiment of the present application, the non-conductive material portion 14 may be an insulator material such as, for example, a dielectric oxide, a dielectric nitride, a dielectric oxynitride, undoped glass, fluorosilicate glass, borosilicate glass, or a dielectric material having a dielectric constant that is less than silicon dioxide (i.e., low k dielectric). The non-conductive material portion 14 is typically an insulator material when the conductive material portion 16 of the base structure 12 is a topmost surface of a gate electrode of a field effect transistor.

The base structure 12 including the conductive material portion 16 and the non-conductive material portion 14 can be formed utilizing any well known semiconductor device fabrication process(es) including for example, a gate-first or gate-last fabrication process. In some embodiments, the conductive material portion 16 can be formed by introducing n-type or p-type dopants within a semiconductor material by well known processes such as, for example, ion implantation or gas phase doping.

The dielectric structure 18 includes a dielectric material 20 that has been processed to include the contact opening 22 formed therein. Although a single contact opening 22 is described and illustrated, a plurality of contact openings can be formed. The dielectric material 20 may include one of the insulator materials mentioned above for the non-conductive material portion 14 of the base structure 12. A single insulator material may be used to define the dielectric material 20 or a multilayered stack including at least two different insulator materials may be used to define the dielectric material 20. In one embodiment, the dielectric material 20 that defines the dielectric structure 18 may comprise a same insulator material as the non-conductive material portion 14 of the base structure 12. In another embodiment, the dielectric material 20 that defines the dielectric structure 18 may comprise a different insulator material than the non-conductive material portion 14 of the base structure 12. The dielectric material 20 that defines the dielectric structure 18 can have a thickness from 50 nm to 200 nm, although other thicknesses that are lesser than, or greater than, this thickness range may also be used as the thickness of the dielectric material 20 that defines the dielectric structure 18. The dielectric structure 18 may be formed by deposition of an insulator material and then patterning the insulator material utilizing photolithography and etching to define the contact opening 22. Contact opening 22 typically has an aspect ratio (i.e., width to height) from 1:3 to 1:10.

Lithography includes forming a photoresist material (not shown) atop a material or material stack to be patterned. The photoresist material may include a positive-tone photoresist composition, a negative-tone photoresist composition or a hybrid-tone photoresist composition. The photoresist material may be formed by a deposition process such as, for example, spin-on coating. After forming the photoresist material, the deposited photoresist material is subjected to a pattern of irradiation. Next, the exposed photoresist material is developed utilizing a conventional resist developer. This provides a patterned photoresist atop a portion of the oxide-containing hard mask material. The pattern provided by the patterned photoresist structure is thereafter transferred into the underlying material layer or material layers utilizing at least one pattern transfer etching process. Typically, the at least one pattern transfer etching process is an anisotropic etch. In one embodiment, a dry etching process such as, for example, reactive ion etching can be used. In another embodiment, a chemical etchant can be used. In still a further embodiment, a combination of dry etching and wet etching can be used. Notwithstanding the type of etch employed, the etch stop on a topmost surface of base structure 12. The patterned resist material may be removed at this point of the present application by utilizing a resist removal process such as, for example, ashing.

Figure 2:
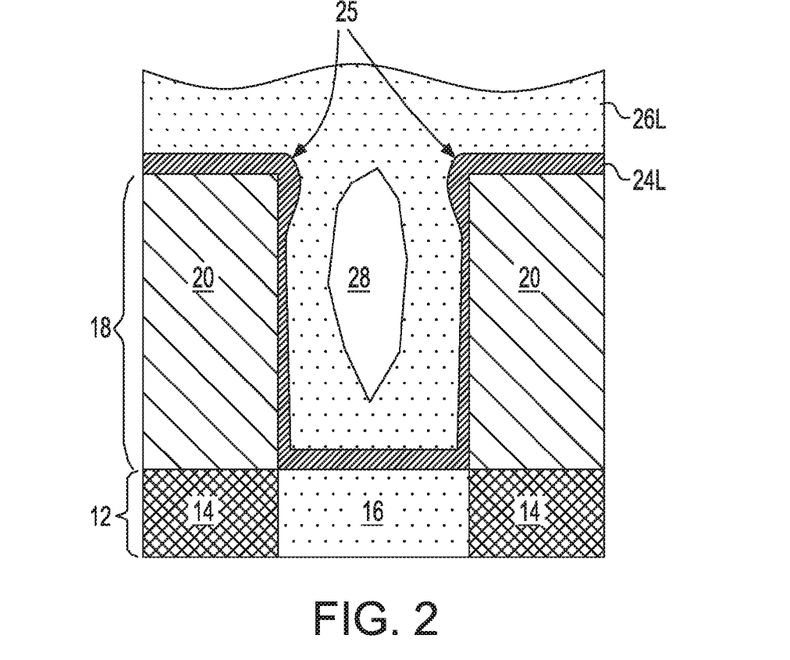
FIG. 2 is a cross sectional view of the exemplary contact structure of FIG. 1 after forming a diffusion barrier layer and a contact metal within the contact opening and above a topmost surface of the dielectric structure.

Referring now to FIG. 2, there is illustrated the exemplary contact structure of FIG. 1 after forming a diffusion barrier layer 24L and a contact metal 26L within the contact opening 22 and above a topmost surface of the dielectric structure 18.

The diffusion barrier layer 24L is a continuous layer (i.e., with any breaks or interruption) that covers the entirety of the exposed topmost and sidewall surfaces of the dielectric structure 18 (i.e., dielectric material 20), and the exposed topmost surface of the conductive material portion 16 of the base structure 12. The diffusion barrier layer 24L can include an overhang region 25 that is located at an upper portion of, and at each side of, the contact opening 22. The diffusion barrier layer 24L can include Co, CoN, Ir, Pt, Pd, Ta, TaN, Ti, TiN, Ru, RuN, RuTaN, W, WN or any other material that can prevent diffusion of a contact metal (to be subsequently formed) from diffusing therethough; thus the diffusion barrier cannot include the same material as the contact metal to be subsequently formed. In some embodiments, the diffusion barrier layer 24L comprises a single layer of a diffusion barrier material. In other embodiments, the diffusion barrier layer comprises a multilayered stack of two different diffusion barrier materials. In one example, Ti/TiN or Ta/TaN can be used.

The diffusion barrier layer 24L can be formed by a deposition process including, for example, chemical vapor deposition (CVD), plasma enhanced chemical vapor deposition (PECVD), atomic layer deposition (ALD), physical vapor deposition (PVD) or plating. The diffusion barrier layer 24L can have a thickness from 1 nm to 20 nm, although other thicknesses that are lesser than, or greater than, this thickness range may also be used as the thickness of the diffusion barrier layer 24L.

After forming the diffusion barrier layer 24L, contact metal 26L is formed on the diffusion barrier layer 24L. The contact metal 26L includes a void (i.e., keyhole) 28 therein. The void 28 is entirely surrounded by contact metal 26L. The contact metal 26L may include a conductive metal or metal alloy. Examples of conductive metals that can be used as the contact metal 26L include one of Cu, W, Al, Ru or Cu. Typically, W is used as the material that provides contact metal 26L. The contact metal 26L can be formed utilizing a deposition process such as, for example, chemical vapor deposition (CVD), plasma enhanced chemical vapor deposition (PECVD), atomic layer deposition (ALD), physical vapor deposition (PVD) or electroless deposition. In some embodiments of the present application, the contact metal 26L can have a thickness from greater than 50 nm to 250 nm.

Figure 3:
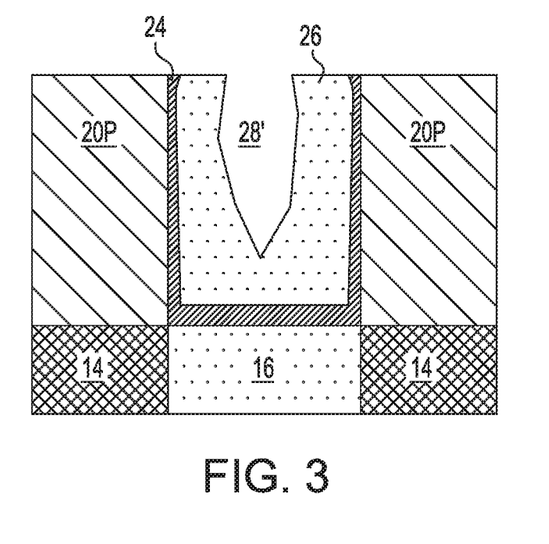
FIG. 3 is a cross sectional view of the exemplary contact structure of FIG. 2 after performing a planarization process.

Referring now to FIG. 3, there is illustrated the exemplary contact structure of FIG. 2 after performing a planarization process. The planarization process that can be used to provide the exemplary contact structure shown in FIG. 3 may include chemical mechanical polishing (CMP) and/or grinding.

The planarization process removes portions of the contact metal 26L and the diffusion barrier layer 24L that are present outside the contact opening 22 and that are located above a topmost surface of the dielectric structure 18. In some embodiments and as shown, an upper portion of the dielectric structure 18 (i.e., the dielectric material 20) can be removed. After planarization, void 28 is opened. The opened void is labeled as element 28' in FIG. 3 of the present application.

After planarization, a portion of the diffusion barrier layer 24L, and a portion of the contact metal 26L remain. When the planarization removes an upper portion of the dielectric structure 18 (i.e., the dielectric material 20), a portion of the dielectric material 20 also remains. The remaining portion of the diffusion barrier layer 24L can be referred to herein as a diffusion barrier material 24, the remaining portion of the contact metal 26L may be referred to herein as contact metal portion 26, while the remaining portion of the dielectric material 20 may be referred to herein as dielectric material portion 20P. As is shown, the diffusion barrier material 24 and the contact metal portion 26 have topmost surfaces that are coplanar with a topmost surface of the dielectric material portion 20P.

Figure 4:
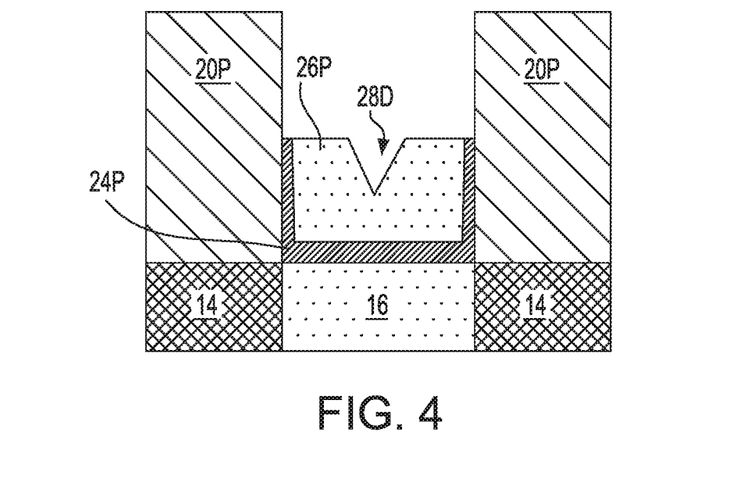
FIG. 4 is a cross sectional view of the exemplary contact structure of FIG. 3 after performing a recessing process to provide a diffusion barrier portion and a first contact metal structure.

Referring now to FIG. 4, there is illustrated the exemplary contact structure of FIG. 3 after performing a recessing process to provide a diffusion barrier portion 24P and a first contact metal structure 26P. The diffusion barrier portion 24P includes a remaining portion of the diffusion barrier material 24, while the first contact metal structure 26P includes a remaining portion of the contact metal portion 26.

As shown, the first contact metal structure 26P includes a divot located at an upper portion thereof. The divot 28D includes a remaining portion of the opened void 28'. As is further shown, a topmost surface of the diffusion barrier portion 24P is coplanar with a topmost surface of the first contact metal structure 26P, but not with the topmost surface of the dielectric material portion 20P.

The recessing that provides the exemplary contact structure shown in FIG. 4 of the present application may include an anisotropic etching process such as, for example, reactive ion etching. The anisotropic etch that is used in the present application to provide the exemplary contact structure shown in FIG. 4 removes the diffusion barrier material 24 and the contact metal portion 26 selective to a dielectric material portion 20P.

Figure 5:
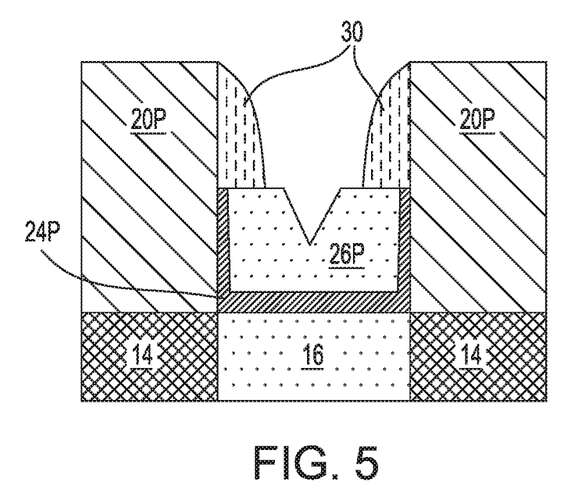
FIG. 5 is a cross sectional view of the exemplary contact structure of FIG. 4 after forming a pair of spaced apart dielectric spacers within a remaining portion of the contact opening and on each exposed sidewall surface of the dielectric structure.

Referring now to FIG. 5, there is illustrated the exemplary contact structure of FIG. 4 after forming a pair of spaced apart dielectric spacers 30 within a remaining portion of the contact opening 22. Each dielectric spacer 30 is located on a topmost surface of the diffusion barrier portion 24P and a portion of the topmost surface of the first contact metal structure 26P and contacts an exposed sidewall surface of the dielectric structure 18 (i.e., dielectric material portion 20P).

Each dielectric spacer 30 may include a spacer dielectric material such as, for example, silicon dioxide and/or silicon nitride. Each dielectric spacer 30 can be formed by depositing a spacer dielectric material and thereafter a spacer etch can be performed. Each dielectric spacer 30 may have a first height along a sidewall surface of the dielectric material portion 20P that is greater than a second height that extends outward from the sidewall surface of the dielectric material portion 20P. Each dielectric spacer 30 can have a topmost surface that slants downward from an outermost sidewall that directly contacts the sidewall surface of the dielectric material portion 20P to an innermost sidewall surface. The innermost sidewall surface (and thus the entirety of each dielectric spacer 30) does not extend above, or into, the divot 28D.

Figure 6:
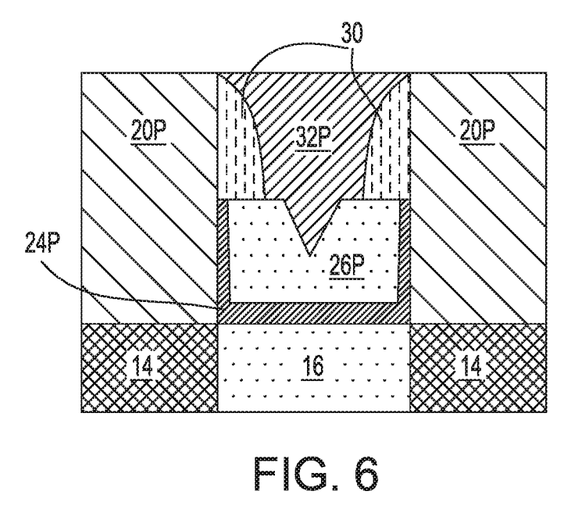
FIG. 6 is a cross sectional view of the exemplary contact structure of FIG. 5 after forming a second contact metal structure within a remaining portion of the contact opening.

Referring now to FIG. 6, there is illustrated the exemplary contact structure of FIG. 5 after forming a second contact metal structure 32P within a remaining portion of the contact opening 22. The second contact metal structure 32P completely fills the gap within the remaining portion of the contact opening 22 that is located between the pair of dielectric spacers 30 and completely fills in the divot 28D that is present within the upper portion of the first contact metal structure 26P. As is shown, the entire bottom surface of the second contact metal structure 32P is in directly physical contact with an underlying portion of the first contact metal structure 26P. No void (i.e., keyhole) is present in any of the first contact metal structures 26P and the second contact metal structure 32P.

The second contact metal structure 32P may include one of the contact metals mentioned above in providing the first contact metal structure 26P. In one embodiment, the second contact metal structure 32P and the first contact metal structure 26P comprise a same contact metal. In one example, W is used as the contact metal of both the first and second contact metal structures (26P, 32P). The second contact metal structure 32P may be formed utilizing one of the deposition processes mentioned for providing contact metal 26. Following the deposition, a planarization process (such as defined above) can be used to provide the exemplary contact structure shown in FIG. 6 of the present application.

Notably, FIG. 6 illustrates an exemplary semiconductor structure of the present application which containing at least one contact structure. The at least one contact structure includes, from bottom to top, a base structure 12 and a dielectric structure 18. A conductive material portion 16 is embedded in the base structure 12. A contact opening 22 is located within the dielectric structure 18. A diffusion barrier portion 24P is located within a lower portion of the contact opening 22, and a first contact metal structure 26P is located on the diffusion barrier portion 24P. In accordance with this embodiment of the present application, a divot 28D is present at an upper portion of the first contact metal structure 26P. The at least one contact structure also includes a pair of spaced apart dielectric spacers 30 located within the contact opening 22 and on a topmost surface of the diffusion barrier portion 24P and a portion of a topmost surface of the first contact metal structure 26P. Each dielectric spacer 30 has a sidewall surface contacting a sidewall surface of the dielectric structure 18. The at least one contact structure further includes a second contact metal structure 32P located within the contact opening 22 and between the pair of dielectric spacers 30. A portion of the second contact metal structure 26P completely fills the divot 28D present in the first contact metal structure 26P.

The method of the present application that is described above and illustrated in FIGS. 1-6 provides one embodiment of the present application in which the keyhole problem mentioned above is eliminated by first opening the keyhole (i.e., void) that is formed within the first contact metal and then filling the remaining portion of the keyhole (void) with the second contact metal that provides the second contact metal structure 32P. Moreover, the method of the present application that is described above and illustrated in FIGS. 1-6 decreases the parasitic capacitance by introducing a pair of dielectric spacers 30 within the contact opening 22.

Figure 7:
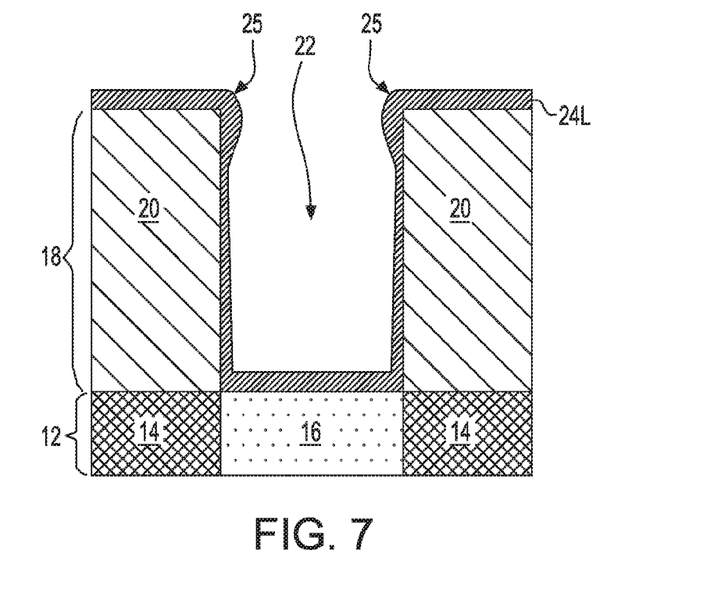
FIG. 7 is a cross sectional view of the exemplary contact structure of FIG. 1 after forming a diffusion barrier layer within the contact opening in accordance with another embodiment of the present application.

Referring now to FIG. 7, there is illustrated the exemplary contact structure of FIG. 1 after forming a diffusion barrier layer 24L within the contact opening 22 and atop the dielectric structure 18 (i.e., on a topmost surface of each dielectric material structure 20) in accordance with another embodiment of the present application. The diffusion barrier layer 24L contains an overhang region 25 that is located at an upper portion of, and at each side of, the contact opening 22. The diffusion barrier layer 24L that is employed in this embodiment of the present application can include one of the diffusion barrier materials mentioned above in providing the diffusion barrier layer 24L to the exemplary contact structure shown in FIG. 2 of the present application. The diffusion barrier layer 24L that is employed in this embodiment of the present application can be formed utilizing one of the deposition processes mentioned above in providing the diffusion barrier layer 24L to the exemplary contact structure shown in FIG. 2 of the present application.

Figure 8:
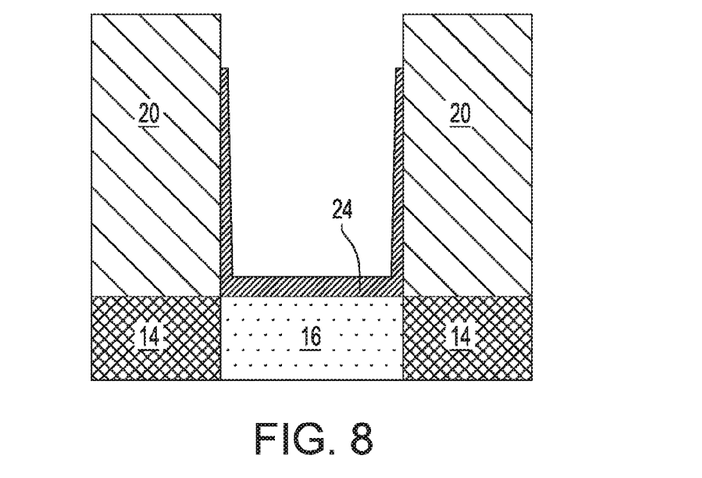
FIG. 8 is a cross sectional view of the exemplary contact structure of FIG. 7 after recessing the diffusion barrier layer.

Referring now to FIG. 8, there is illustrated the exemplary contact structure of FIG. 7 after recessing the diffusion barrier layer 24L to provide a diffusion barrier material 24 within the contact opening 22. The recessing of the diffusion barrier layer 24L that provides the diffusion barrier material 24 within the contact opening 22 removes the overhang region 25 of the diffusion barrier layer from the exemplary structure. The recessing of the diffusion barrier layer 24L that provides the diffusion barrier material 24 can be performed utilizing an anisotropic etching process, such as, for example reactive ion etching. The anisotropic etching process removes a portion of the diffusion barrier layer 24L selective to the dielectric material 20 of the dielectric material structure 18.

Figure 9:
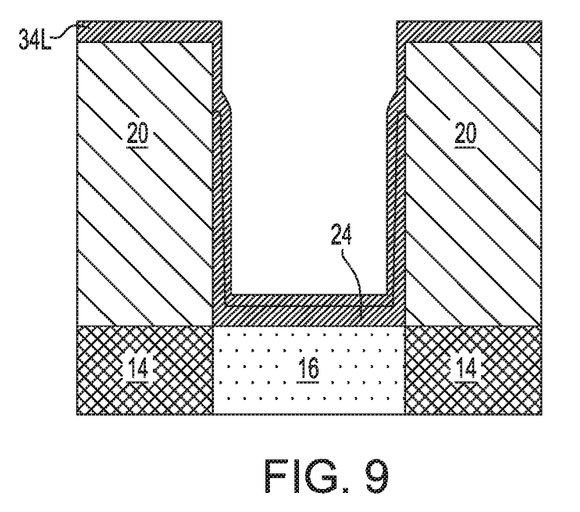
FIG. 9 is a cross sectional view of the exemplary contact structure of FIG. 8 after forming another diffusion barrier layer.

Referring now to FIG. 9, there is illustrated the exemplary contact structure of FIG. 8 after forming another diffusion barrier layer 34L. As is shown, the another diffusion barrier layer 34L is a contiguous layer that covers the entirety of the diffusion barrier material 24 and any exposed surfaces (i.e., sidewall and topmost) of the dielectric material 20.

The another diffusion barrier layer 34L can include one of the diffusion barrier materials mentioned above in providing diffusion barrier layer 24L to the exemplary contact structure shown in FIG. 7 of the present application. In one embodiment, the another diffusion barrier layer 34L may include a same diffusion barrier material as diffusion barrier layer 24L. In another embodiment, the another diffusion barrier layer 34L may include a different diffusion barrier material than diffusion barrier layer 24L. The another diffusion barrier layer 34L may be referred to as a second diffusion barrier layer, while the diffusion barrier layer 24L may be referred to as a first diffusion barrier layer. The another diffusion barrier layer 34L that is employed in this embodiment of the present application can be formed utilizing one of the deposition processes mentioned above in providing the diffusion barrier layer 24L to the exemplary contact structure shown in FIG. 2 of the present application.

Figure 10:
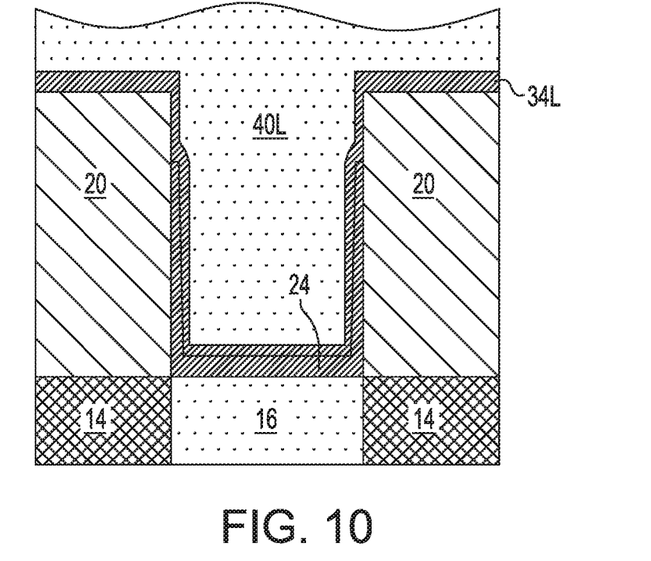
FIG. 10 is a cross sectional view of the exemplary contact structure of FIG. 9 after forming a contact metal.

Referring now to FIG. 10, there is illustrated the exemplary contact structure of FIG. 9 after forming a contact metal 40L. Contact metal 40L that can be employed in this embodiment of the present application may include one of the contact metals mentioned above in providing contact metal 26L to the exemplary contact structure shown in FIG. 2 of the present application. The contact metal 40L that is employed in this embodiment of the present application can be formed utilizing one of the deposition processes mentioned above in providing the contact metal 26L to the exemplary contact structure shown in FIG. 2 of the present application. Unlike the contact metal 26L provided to exemplary contact structure shown in FIG. 2 of the present application, the contact metal 40L provided in this embodiment of the present application lacks any void. Void formation within contact metal 40L is eliminated due to the presence of the diffusion barrier material 24 and the another diffusion barrier layer 34L.

Figure 11:
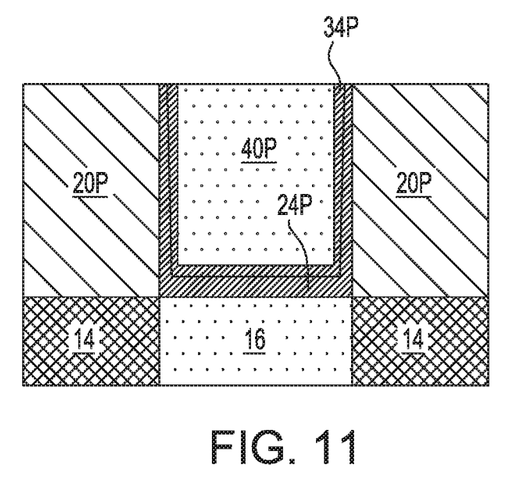
FIG. 11 is a cross sectional view of the exemplary contact structure of FIG. 10 after performing a planarization process.

Referring now to FIG. 11, there is illustrated the exemplary contact structure of FIG. 10 after performing a planarization process. The planarization process that can be used to provide the exemplary contact structure shown in FIG. 3 may include chemical mechanical polishing (CMP) and/or grinding.

The planarization process removes portions of the contact metal 40L and the another diffusion barrier layer 34L that are present outside the contact opening 22 and that are located above a topmost surface of the dielectric structure 18. The planarization process may also remove a portion of diffusion barrier material 24 and an upper portion of the dielectric structure 18 (i.e., the dielectric material 20).

After planarization, a portion of the another diffusion barrier layer 34L, a portion of the diffusion barrier material 24, a portion of the contact metal 40L and a portion of the dielectric material 20 remain. The remaining portion of the another diffusion barrier layer 34L can be referred to herein as a diffusion barrier portion 34P, the remaining portion of the contact metal 40L may be referred to herein as contact metal structure 40P, the remaining portion of diffusion barrier material 24 may be referred to herein as diffusion barrier portion 24P, the remaining portion of the dielectric material 20 may be referred to herein as dielectric material portion 20P. As is shown, each the diffusion barrier portion (24P, 34P) and the contact metal structure 40P have topmost surfaces that are coplanar with a topmost surface of the dielectric material portion 20P.

The method of the present application that is described above and illustrated in FIGS. 7-11 provides another embodiment of the present application in which the keyhole problem mentioned above is eliminated by removing the overhang of the diffusion barrier layer 24L.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a contact structure, said method comprising:
   providing, from bottom to top, a base structure and a dielectric structure, wherein a conductive material portion is embedded in said base structure, and wherein a contact opening is located within said dielectric structure and exposes a topmost surface of said conductive material portion and vertical sidewall surfaces of said dielectric structure;
   forming a first continuous diffusion barrier layer within said contact opening, wherein said first continuous diffusion barrier layer contacts an entire exposed topmost surface of said conductive material portion and is in direct contact with said entire exposed vertical sidewall surfaces of said dielectric structure, and wherein said first continuous diffusion barrier layer contains an overhang region located in an upper portion of said contact opening;
   etching said upper portion of said first continuous diffusion barrier layer to remove said overhang region and to expose an upper portion of said vertical sidewall surfaces of said dielectric structure, while maintaining a lower portion of said first continuous diffusion barrier layer in said contact opening, wherein said lower portion of said first continuous barrier layer includes a horizontal portion that is present on said entire topmost surface of said conductive material portion;
   forming a second continuous diffusion barrier layer directly on entire exposed surfaces of said first continuous diffusion barrier layer including said horizontal portion of said first continuous diffusion barrier layer, said exposed upper portion of said vertical sidewall surfaces of the dielectric structure, and a topmost surface of said dielectric structure;

forming a contact metal within said opening and directly on said second diffusion barrier layer; and removing portions of said contact metal and said second diffusion barrier layer that are present on said topmost surface of said dielectric structure, wherein after removing portions of said contact metal and said second diffusion barrier layer that are present on said topmost surface of said dielectric structure, a topmost surface of a remaining portion of said contact metal and a topmost surface of a remaining portion of said second diffusion barrier layer are coplanar with each as well as being coplanar with said topmost surface of said first diffusion barrier layer and said topmost surface of said dielectric structure.

2. The method of claim 1, wherein said etching process comprises an anisotropic etch.

3. The method of claim 1, wherein said first diffusion barrier layer and second diffusion barrier layer comprise a same diffusion barrier material.

4. The method of claim 1, wherein said first diffusion barrier layer and second diffusion barrier layer comprise different diffusion barrier materials.

5. The method of claim 1, wherein said contact metal comprises a conductive metal or a metal alloy.

6. The method of claim 1, wherein said removing said portions of said contact metal and said second diffusion barrier layer further removes an upper portion of said dielectric structure.

7. The method of claim 6, wherein said removing portions of said contact metal and said second diffusion barrier layer comprises a planarization process.

8. The method of claim 7, wherein after performing said planarization process, a U-shaped second diffusion barrier portion remains in said contact opening.

9. The method of claim 1, wherein said conductive material portion embedded in said base structure is a doped semiconductor material, and said doped semiconductor material is surrounded on both sides by a semiconductor material.

10. The method of claim 1 wherein said conductive material portion embedded in said base structure is at least one of an elemental metal, an alloy of at least two elemental metals, an elemental metal nitride, an elemental metal silicide, and a doped semiconductor material, and said conductive material portion is surrounded on both sides by an insulator material.

11. The method of claim 1, wherein said forming said contact metal is performed without forming a void in said contact metal.

* * * * *